(12) United States Patent
Ikeda et al.

(10) Patent No.: US 7,570,184 B2
(45) Date of Patent: Aug. 4, 2009

(54) OPTICAL ANALOG/DIGITAL CONVERSION METHOD AND APPARATUS THEREOF

(75) Inventors: Kensuke Ikeda, Suita (JP); Ken-ichi Kitayama, Suita (JP)

(73) Assignee: Osaka University, Suita-shi (JP)

( * ) Notice: Subject to any disclaimer, the term of this patent is extended or adjusted under 35 U.S.C. 154(b) by 109 days.

(21) Appl. No.: 11/912,531

(22) PCT Filed: Apr. 26, 2006

(86) PCT No.: PCT/JP2006/308760

§ 371 (c)(1),
(2), (4) Date: Oct. 25, 2007

(87) PCT Pub. No.: WO2006/118153

PCT Pub. Date: Nov. 9, 2006

(65) Prior Publication Data

US 2009/0047017 A1 Feb. 19, 2009

(30) Foreign Application Priority Data

Apr. 27, 2005 (JP) ............... 2005-130232

(51) Int. Cl.
*G02F 7/00* (2006.01)
(52) U.S. Cl. .............. 341/137; 359/238; 385/5
(58) Field of Classification Search ........ 341/137, 341/155; 385/5–9; 359/238, 244
See application file for complete search history.

(56) References Cited

U.S. PATENT DOCUMENTS

| | | | | |
|---|---|---|---|---|
| 4,926,177 A | * | 5/1990 | Sakata | 341/137 |
| 4,947,170 A | * | 8/1990 | Falk | 341/137 |
| 6,160,504 A | * | 12/2000 | Fields et al. | 341/137 |
| 6,175,320 B1 | * | 1/2001 | Heflinger | 341/137 |
| 6,700,517 B1 | * | 3/2004 | Kellar | 341/137 |
| 7,212,140 B2 | * | 5/2007 | Soderberg et al. | 341/137 |
| 7,403,143 B2 | * | 7/2008 | Hirono et al. | 341/137 |
| 7,423,564 B2 | * | 9/2008 | Kitayama et al. | 341/137 |
| 2001/0020908 A1 | * | 9/2001 | Prucnal | 341/137 |

FOREIGN PATENT DOCUMENTS

JP 2000 10129 1/2000

OTHER PUBLICATIONS

Jeong, et al, "All-optical analog-to-digital and digital-to-analog conversion implemented by a nonlinear fiber interferometer", Optics Communications, vol. 91, No. 1, pp. 115-122, 1992.

(Continued)

*Primary Examiner*—Howard Williams
(74) *Attorney, Agent, or Firm*—Oblon, Spivak, McClelland, Maier & Neustadt, P.C.

(57) ABSTRACT

A high speed optical analog/digital conversion process with a simple configuration, in which an optical-pulse branching delay multiplexer generates as many duplicates of each optical pulse as the predetermined number of bits by branching each optical pulse string obtained by sampling an input optical analog signal, and generates a temporally consecutive optical pulse string by multiplexing the duplicated optical pulses with a predetermined intensity difference and time difference. An optical encoder and an optical-threshold processing unit perform an encoding and a quantization of an optical pulse string, and output an optical digital signal corresponding to the optical analog signal.

12 Claims, 11 Drawing Sheets

OTHER PUBLICATIONS

Ikeda, et al., "Photonic AD conversion—A novel optical quantizing and coding scheme for ultrafast all-optical analog-to-digital converter using nonlinear optical switches based on Sagnac interferometer- ", Technical Report of IEICE, OCS2004-78, OFT2004-41, pp. 57-62, 2004.

Miyoshi, et al., "Simplification of All-Optical Analog-to-Digital Converter Using Split-and-Delay Technique", IEICE Technical Report, OCS2005-44, pp. 51-56, 2005.

Yamamoto, et al., "Demultiplexing of Subterabit TDM Signal by Using ultrafast Nonlinear Optical Loop Mirror", IEICE Trans Electron, vol. E82-C, No. 3, pp. 109-116, 1999.

* cited by examiner

OPTICAL ANALOG/DIGITAL CONVERSION METHOD AND APPARATUS THEREOF

TECHNICAL FIELD

The present invention relates to an optical analog/digital converting method and an optical analog/digital converting apparatus for converting an optical analog signal into an optical digital signal, and more particularly, to an optical analog/digital converting method and an optical analog/digital converting apparatus having a capability of performing a high speed optical analog/digital conversion with simple process and configuration.

BACKGROUND ART

Conventionally, an analog/digital conversion process has been realized by performing a discretization, a quantization, and an encoding, and the discretization, the quantization, and the encoding have been performed by an electrical processing using a semiconductor.

In order to speed up an analog/digital conversion by a light, a method of demultiplexing a time-multiplexed optical signal can be used in the discretization process, such as a four lightwave mixing, a nonlinear loop mirror, and a method using a harmonic generation of an optical crystal. As a method for the quantization process, a method using a higher-order solution, a method using a Raman and a self-frequency shift due to a self-phase modulation, and the like are used.

Patent Document 1: Japanese Patent Application Laid-Open No. 2000-10129

Nonpatent Document 1: Takashi Yamamoto, et al., "Demultiplexing of sub-terabit TDM optical signal using an ultra-high speed nonlinear optical loop mirror", IEICE Transactions, C-I, The Institute of Electronics, Information and Communication Engineers (IEICE), Vol. J82-C-I, Pp. 109-116, March 1999

DISCLOSURE OF INVENTION

Problem to be Solved by the Invention

However, the encoding of the analog/digital conversion by the light was not realized, and eventually, all of the analog/digital conversion process could not be performed by an optical process. Therefore, the inventors of the present invention realized the optical encoding by employing an encoding device such as the one described in Japanese Patent Application No. 2003-386898 and Japanese Patent Application No. 2004-167230 and a threshold processing device, and eventually, could realize the analog/digital conversion process by the light.

However, in the encoding process described above, for example, n units of encoding devices and n units of threshold processing devices are necessary for performing an n-bit encoding, which results in a growing of the equipment in size and a difficulty in the control.

The present invention has been achieved in consideration of the above problems, and it is an object of the present invention to provide an optical analog/digital converting method and an optical analog/digital converting apparatus having a capability of performing an optical analog/digital conversion process with simple process and configuration

Means for Solving Problem

To solve the problems described above and achieve the object, according to an aspect of the present invention, an optical analog/digital converting method includes an optical pulse branch-delay-multiplexing step of generating as many duplicates of each optical analog signal pulse as predetermined number of bits obtained by branching each optical analog signal pulse that is sampled from an input optical analog signal, and generating and outputting a temporally consecutive optical pulse string by multiplexing the each duplicated optical analog signal pulses with a predetermined intensity difference and time difference; and a quantization and encoding step of outputting an optical digital signal corresponding to the optical analog signal by performing an encoding and a quantization of the optical pulse string.

According to the above aspect of the invention, the optical analog/digital converting method further includes a probe light generating step of generating a probe optical pulse string synchronized with the optical pulse string, wherein the quantization and encoding step includes an encoding step of performing a quantization and encoding by using an optical switch that performs an optical output of the probe optical pulse string according to an intensity of the optical pulse string by using a nonlinear optical effect.

According to the above aspect of the invention, in the optical analog/digital converting method, the quantization and encoding step includes multiplexing the optical pulse string and the probe optical pulse string with a predetermined time difference such that the optical pulse string and the probe optical pulse string are temporally overlapped in an optical multiplexer, by using a nonlinear optical loop mirror having two inputs of the optical pulse string and the probe optical pulse string and one output or two outputs of a transmitted light or a reflected light of the probe optical pulse string.

According to the above aspect of the invention, in the optical analog/digital converting method, the optical pulse branch-delay-multiplexing step includes duplicating n pieces of duplicated optical analog signal pulses when performing an n-bit encoding, where n is a natural number, and attenuating or amplifying the n pieces of duplicated optical analog signal pulses such that the n pieces of duplicated optical analog signal pulses have predetermined different intensity ratios.

According to the above aspect of the invention, in the optical analog/digital converting method, the quantization and encoding step includes performing a quantization and encoding by using an optical nonlinear device having a predetermined cycle of an input-output characteristic with respect to an optical intensity, and the optical nonlinear device has at least a cycle of $2^{(n-1)}$ times of a half cycle.

According to the above aspect of the invention, the optical analog/digital converting method, further includes a binary probe light generating step of generating a binary probe optical pulse string synchronized with the optical pulse string, wherein the quantization and encoding step includes a threshold processing step of generating a digital pulse string binarized according to an intensity of the probe optical pulse string quantized and encoded by using a nonlinear optical effect.

According to the above aspect of the invention, an optical analog/digital converting apparatus includes an optical pulse branch-delay-multiplexing device for generating as many duplicates of each optical analog signal pulse as predetermined number of bits obtained by branching each optical analog signal pulse that is sampled from an input optical analog signal, and generating and outputting a temporally consecutive optical pulse string by multiplexing the each duplicated optical analog signal pulses with a predetermined intensity difference and time difference; and a quantization and encoding device for outputting an optical digital signal corresponding to the optical analog signal by performing an encoding and a quantization of the optical pulse string.

According to the above aspect of the invention, the optical analog/digital converting apparatus further includes a probe light generating device for generating a probe optical pulse string synchronized with the optical pulse string, wherein the quantization and encoding device includes an encoding device for performing a quantization and encoding by using an optical switch that performs an optical output of the probe optical pulse string according to an intensity of the optical pulse string by using a nonlinear optical effect.

According to the above aspect of the invention, in the optical analog/digital converting apparatus, the quantization and encoding device multiplexes the optical pulse string and the probe optical pulse string with a predetermined time difference such that the optical pulse string and the probe optical pulse string are temporally overlapped in an optical multiplexer, by using a nonlinear optical loop mirror having two inputs of the optical pulse string and the probe optical pulse string and one output or two outputs of a transmitted light or a reflected light of the probe optical pulse string.

According to the above aspect of the invention, in the optical analog/digital converting apparatus according to the invention, the optical pulse branch-delay-multiplexing device duplicates n pieces of duplicated optical analog signal pulses when performing an n-bit encoding, where n is a natural number, and attenuates or amplifies the n pieces of duplicated optical analog signal pulses such that the n pieces of duplicated optical analog signal pulses have predetermined different intensity ratios.

According to the above aspect of the invention, in the optical analog/digital converting apparatus, the quantization and encoding device performs a quantization and encoding by using an optical nonlinear device having a predetermined cycle of an input-output characteristic with respect to an optical intensity, and the optical nonlinear device has at least a cycle of $2^{(n-1)}$ times of a half cycle.

According to the above aspect of the invention, the optical analog/digital converting apparatus further includes a binary probe light generating means device for generating a binary probe optical pulse string synchronized with the optical pulse string, wherein the quantization and encoding device includes a threshold processing means for generating a digital pulse string binarized according to an intensity of the probe optical pulse string quantized and encoded by using a nonlinear optical effect.

Moreover, in the optical analog/digital converting apparatus according to the above aspects of the invention, the threshold processing device is a nonlinear optical fiber loop mirror having one input and one output and including an optical attenuator arranged asymmetrically in the loop, and performs a binarization of an encoded pulse string with a nonlinear output characteristic with respect to an input intensity of the pulse string.

EFFECT OF THE INVENTION

In the optical analog/digital converting method and the optical analog/digital converting apparatus according to the above aspects of the invention, an optical pulse branch-delay-multiplexing device branches each optical analog signal pulse obtained by sampling an input optical analog signal, generates as many duplicates of the optical analog signal pulse as the predetermined number of bits, multiplexes the duplicated optical analog signal pulses with a predetermined intensity difference and time difference, and generates a temporally consecutive optical pulse string, and a quantization and encoding device outputs an optical digital signal corresponding to the optical analog signal by performing an encoding and a quantization of the optical pulse string. Therefore, it is possible to process with a single quantization and encoding device, and as a result, the optical analog/digital conversion process can be performed with a simple configuration.

EXPLANATIONS OF LETTERS OR NUMERALS

Figure 1:
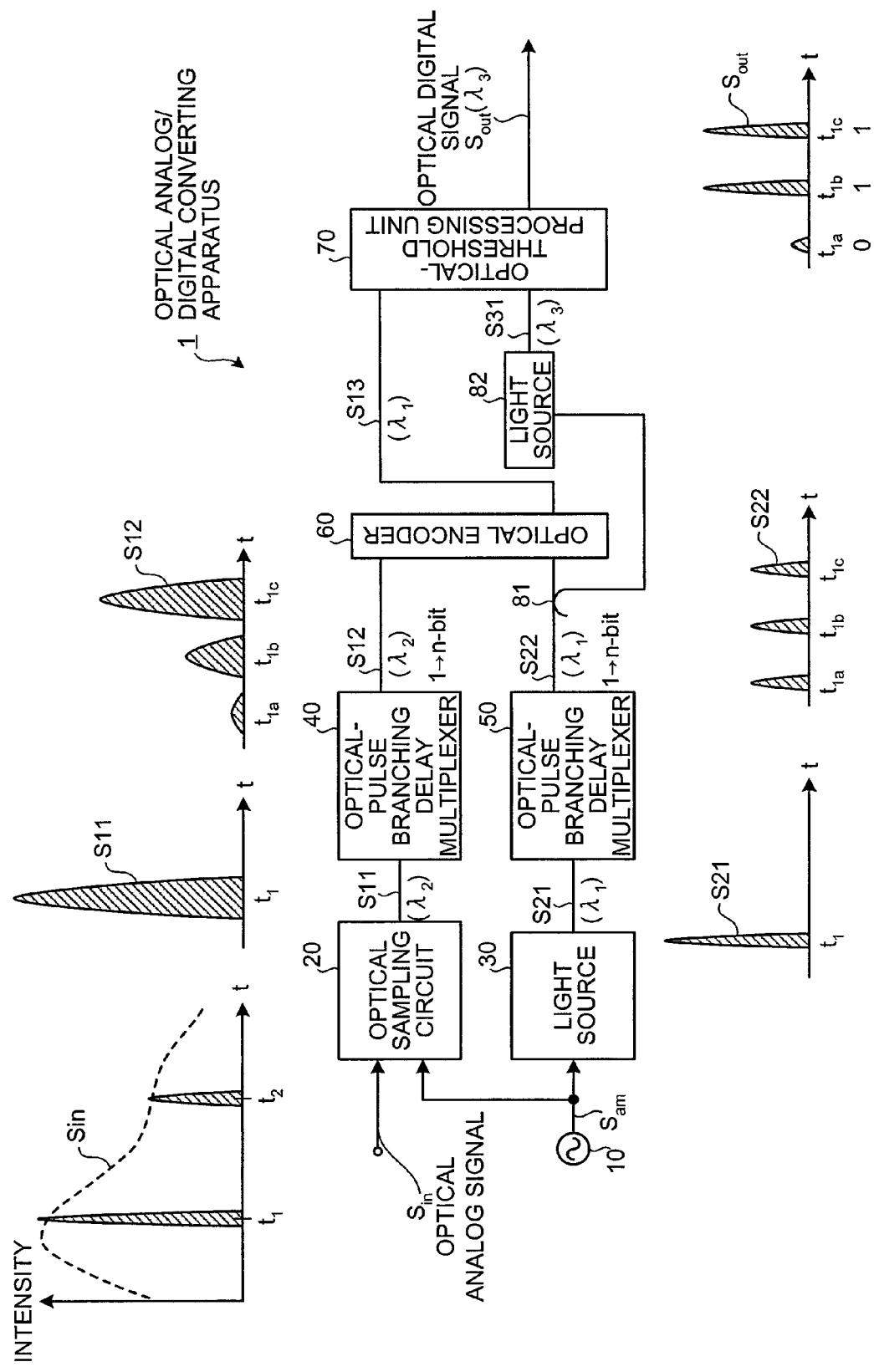
FIG. 1 is a block diagram for illustrating a configuration of an optical analog/digital converting apparatus according to a first embodiment of the present invention.

1, 2 Optical analog/digital converting apparatus
10 Sampling signal generator
20 Optical sampling circuit
30, 82 Light source
40, 50 Optical-pulse branching delay multiplexer
41, 51 Demultiplexer
42-1 to 42-3, 52-1 to 52-3 Optical delay unit
43-1 to 43-3, 176 Optical attenuator
44, 54 Multiplexer
60, 160 Optical encoder
61, 71, 161, 171 High nonlinearity fiber
62, 63, 72, 73, 81, 163, 166, 174, 175 Optical coupler
64, 74, 76 Optical isolator
65, 75, 167 Optical band pass filter
69, 79 Optical fiber cable
70, 170 Optical-threshold processing unit
151, 152, 172 Optical amplifier 153 ODL
162, 173 Optical circulator
164, 165, 175 Polarization controller

BEST MODE(S) FOR CARRYING OUT THE INVENTION

Exemplary embodiments of an optical analog/digital converting method and an optical analog/digital converting apparatus according to the present invention are explained in detail below with reference to the accompanying drawings.

First Embodiment

FIG. 1 is a block diagram for illustrating a configuration of an optical analog/digital converting apparatus according to a first embodiment of the present invention. The optical analog/digital converting apparatus 1 outputs an optical digital signal $S_{out}$ by sampling, encoding, and quantizing an input optical analog signal $S_{in}$.

In FIG. 1, a sampling signal generator 10 generates a signal of a predetermined frequency that becomes a reference for a sampling signal, and outputs the generated signal to an optical sampling circuit 20 and a light source 30. The optical analog signal $S_{in}$ having a wavelength of $\lambda_2$, which is subjected to an optical analog/digital conversion, is input to the optical sampling circuit 20. The optical analog signal $S_{in}$ is sampled in a cycle of the sampling signal input from the sampling signal generator 10, so that an optical pulse string S11 is output. The light source 30 outputs a pulse string of a signal light having a predetermined wavelength $\lambda_1$ with a constant signal level. The optical sampling circuit 20 is implemented by, for example, a heretofore known circuit having a function of an optical TDM demultiplexing process (see Nonpatent Document 1).

An optical-pulse branching delay multiplexer 40 optically branches each pulse of the optical pulse string S11 output from the optical sampling circuit 20, duplicates as many pluses as the number of bits to be encoded, and causes a predetermined time difference with a predetermined intensity ratio with respect to each of the duplicated pulses. After that, the optical-pulse branching delay multiplexer 40 generates a temporally consecutive high speed optical pulse string S12 by multiplexing the duplicated pulses, and outputs the optical pulse string S12 to an optical encoder 60 as a control light. The intensity ratio has preferably a relation of a power of two. For instance, an optical pulse at a sampling timing $t_1$ becomes, in the case of 3 bits, the temporally consecutive pulse string S12 with the intensity ratio of 1:2:4, i.e., $2^0:2^1:2^2$.

In the same manner as the optical-pulse branching delay multiplexer 40, an optical-pulse branching delay multiplexer 50 optically branches each pulse of an optical pulse string S21 output from the light source 30, duplicates as many pluses as the number of bits to be encoded, and causes a predetermined time difference with the same intensity ratio with respect to each of the duplicated pulses. After that, the optical-pulse branching delay multiplexer 50 generates a temporally consecutive high speed optical pulse string S22 by multiplexing the duplicated pulses, and outputs the optical pulse string S22 to the optical encoder 60 as a probe light. The optical-pulse branching delay multiplexer 50 is different from the optical-pulse branching delay multiplexer 40 in a fact that the optical intensities of each pulse of the optical pulse string S22 aligned at the same level. Namely, an n-bit pulse string is generated in synchronization with the optical pulse string generated by the optical-pulse branching delay multiplexer 40.

The optical encoder 60, having a synchronization characteristic of a power level of an output signal light with respect to a power level of the input control light, encodes the optical pulse string S22 that is input as the probe light according to the optical pulse string S12 as the control light, and outputs the encoded optical pulse string to an optical-threshold processing unit 70 as an optical pulse string S13. A cycle in this case is preferably a cycle of $2^{(n-1)}$ times a half cycle (T/2). For instance, in the case of a 3-bit encoding, it is preferable to have a cycle characteristic of four times of the half cycle, i.e., two cycles.

The optical-threshold processing unit 70 quantizes an input signal light S31 having a wavelength of $\lambda_3$ to predetermined binary values according to the encoded optical pulse string S13, and outputs the quantized signal light as the optical digital signal $S_{out}$. An light source 82 outputs the optical pulse string S13 that is output with reference to the optical pulse string S22 that is branched from the optical pulse string S22 output from the optical-pulse branching delay multiplexer 50 by an optical coupler 81. Although the optical-threshold processing unit 70 is explained with an example of a 1-bit quantization, the quantization can be performed in multiple values.

Figure 2:
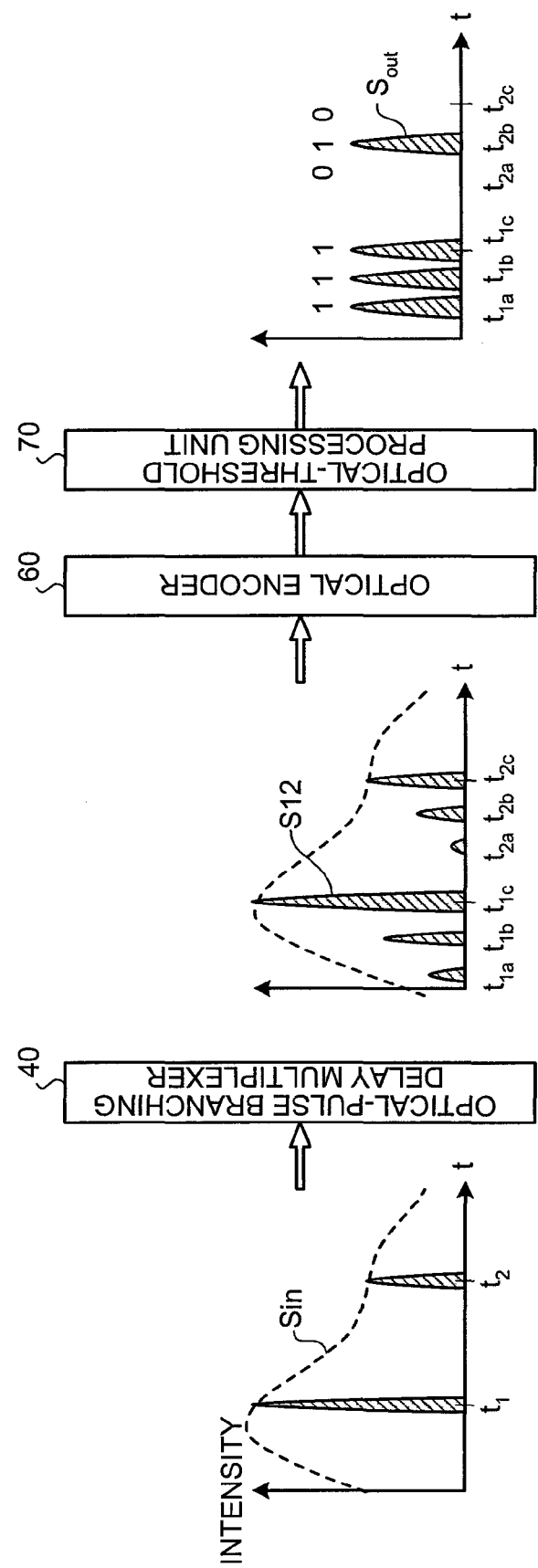
FIG. 2 is a block diagram for explaining an outline of an operation of the optical analog/digital converting apparatus shown in FIG. 1.

An overall operation of the optical analog/digital converting apparatus 1 is explained below with reference to FIG. 2. As shown in FIG. 2, the input optical analog signal $S_{in}$ is sampled at timings $t_1$ and $t_2$, and output to the optical-pulse branching delay multiplexer 40. The optical-pulse branching delay multiplexer 40 outputs, in the case of an n-bit encoding, a temporally consecutive optical pulse string with an optical intensity ratio of $1:2\cdot1:\ldots:2\cdot(n-1)$ and a predetermined time difference. For instance, in the case of the 3-bit encoding, the optical pulse string S12 of three pulses having the optical intensity ratio of 1:2:4 is output in a serial manner. After that, the optical pulse string S12 is sequentially encoded by a single unit of the optical encoder 60, sequentially binarized by a single unit of the optical-threshold processing unit 70, and output the binarized optical digital signal $S_{out}$.

Figure 3:
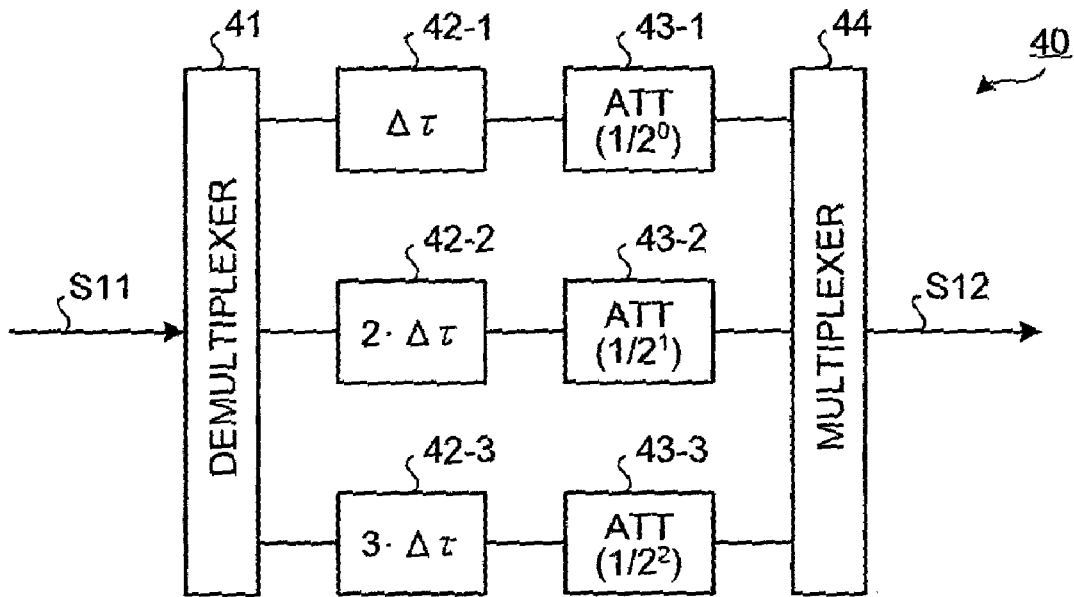
FIG. 3 is a block diagram for illustrating a detailed configuration of an optical-pulse branching delay multiplexer that generates a control light.

FIG. 3 is a block diagram for illustrating a detailed configuration of the optical-pulse branching delay multiplexer 40. The optical-pulse branching delay multiplexer 40 is represented as a case corresponding to the 3-bit encoding. As shown in FIG. 3, the input optical pulse string S11 is branched with the same intensity ratio by a demultiplexer 41. Delay amounts of $\Delta\tau$, $2\cdot\Delta\tau$, and $3\cdot\Delta\tau$ are given to the branched duplicated optical pulses, respectively, by optical delay units 42-1 to 42-3, so that a predetermined time difference $\Delta\tau$ is assigned between the duplicated optical pulses. Furthermore, attenuation amounts of $(\frac{1}{2}^0):(\frac{1}{2}^1):(\frac{1}{2}^2)$ are given to the duplicated optical pulses, respectively, by optical attenuators 43-1 to 43-3. After that, a multiplexer 44 generates the optical pulse string S12 by multiplexing the duplicated optical pulses.

Figure 4:
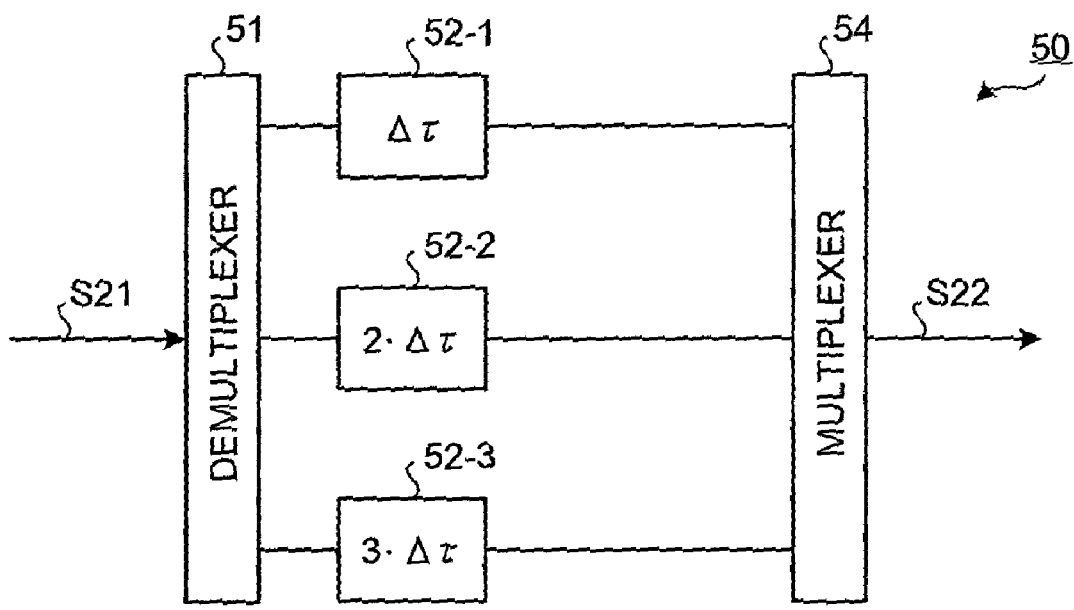
FIG. 4 is a block diagram for illustrating a detailed configuration of an optical-pulse branching delay multiplexer that generates a probe light.

FIG. 4 is a block diagram for illustrating a detailed configuration of the optical-pulse branching delay multiplexer 50. As shown in FIG. 4, the optical-pulse branching delay multiplexer 50 has a configuration obtained by removing the optical attenuators 43-1 to 43-3 from the optical-pulse branching delay multiplexer 40. Therefore, the optical pulse string S22 output from a multiplexer 54 has the optical intensity of the same level.

Figure 5:
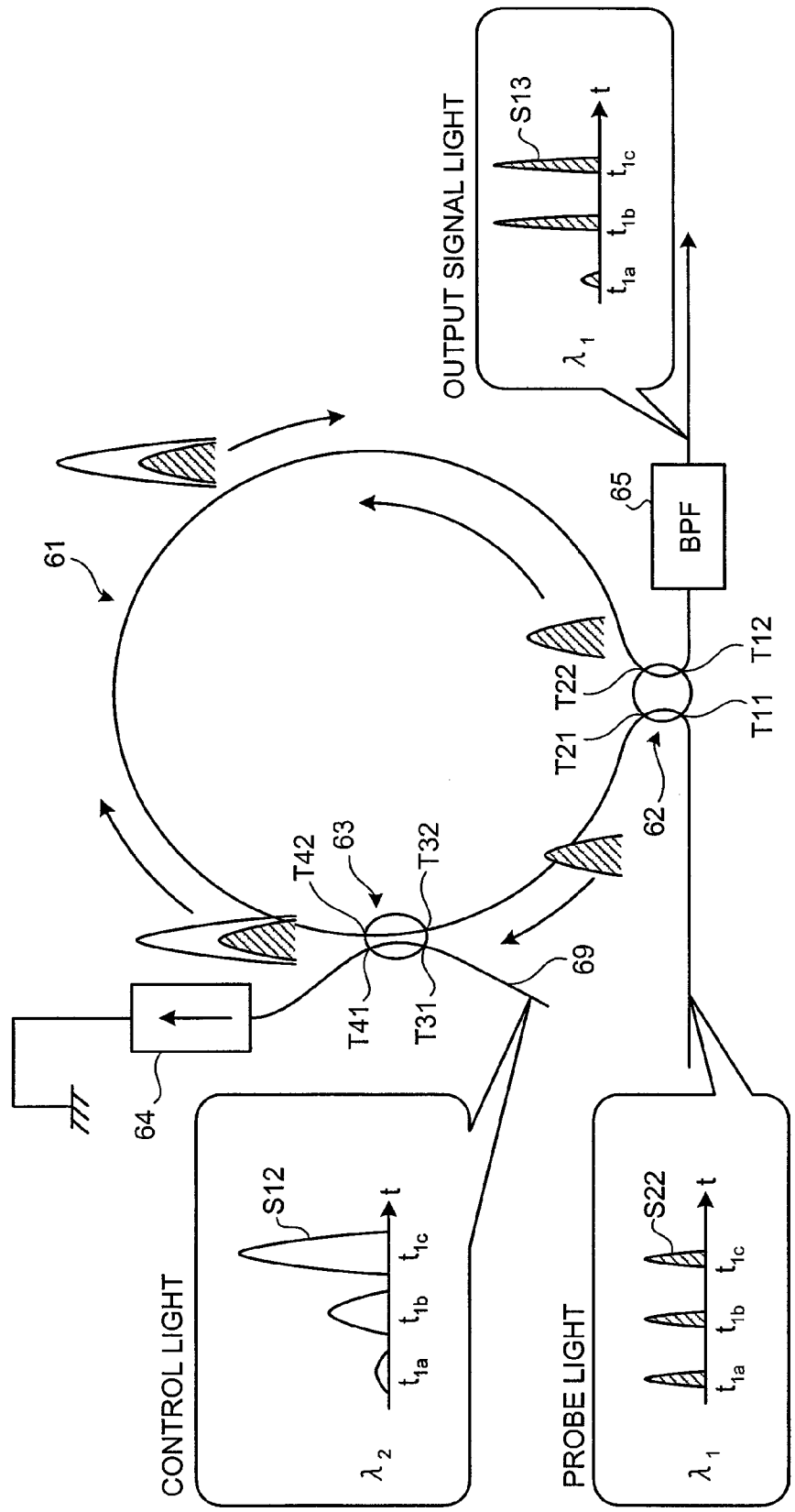
FIG. 5 is a block diagram for illustrating a detailed configuration of an optical encoder shown in FIG. 1.

FIG. 5 is a block diagram for illustrating a detailed configuration of the optical encoder 60. As shown in FIG. 5, the optical encoder 60 is a Non-linear Optical Loop Mirror including a high nonlinearity fiber 61, two optical couplers 62 and 63, an optical isolator 64, and an optical band pass filter (BPF) 65.

In order to solve a problem of a walk-off caused by a different group delay between the control light of the optical pulse string S12 and the signal light of the optical pulse string S22, the nonlinear optical loop mirror is configured by arranging wavelengths having dispersions with which the walk-off becomes small enough or forming a loop by cascading a plurality of dispersion high nonlinearity fiber cables of a predetermined lengths having different group delay characteristics or dispersions. The optical coupler 62 is provided to optically couple a vicinity of one end of the high nonlinearity fiber 61 and a vicinity of the other end of the high nonlinearity fiber 61.

Furthermore, a separate optical fiber cable 69 is closely arranged to be optically coupled to an optical fiber cable of the high nonlinearity fiber 61 at a vicinity of a terminal T21 of the optical coupler 62, and the optical coupler 63 is provided at a portion where the optical fiber cable 69 is arranged close to the high nonlinearity fiber 61. In addition, the other end of the optical fiber cable 69 is terminated in an antireflecting manner via the optical isolator 64. Therefore, the control light is input from one end of the optical fiber cable 69, passes the optical coupler 63. One portion of the control light is terminated in an antireflecting manner via the optical isolator 64; however, the other portion of the control light branched by the optical coupler 63 is output to the loop of the high nonlinearity fiber 61 via a terminal T42 of the optical coupler 63. At a terminal 12 of the high nonlinearity fiber 61, the optical band pass filter 65 is connected to pass only the wavelength $\lambda_1$ of the probe light.

In the nonlinear optical loop mirror configured as described above, in the case where a branching ratio of the optical coupler 62 is set to 1:1, the probe light input to a terminal T11 is totally reflected to an input terminal side. According to the first embodiment, it is necessary to pass the input probe light to an output terminal side. Because phase differences experienced by a probe light propagating in a clockwise direction and a probe light propagating in a counterclockwise direction can be changed by giving a phase shift to only the probe light propagating in the clockwise direction using the pulse string of the control light, it is possible to select whether to reflect or transmit the input signal light. Therefore, the high nonlinearity fiber 61 can be applied to a switching of the optical encoder 60 and a threshold processing of the optical-threshold processing unit 70.

According to the first embodiment, an output level of the signal light is changed according to a signal level of the control light by causing a phase difference between a pulse propagating in the clockwise direction and a pulse propagating in the counterclockwise direction in the nonlinear optical loop mirror using a cross phase modulation (XPM) between the probe light and the control light.

Figure 6:
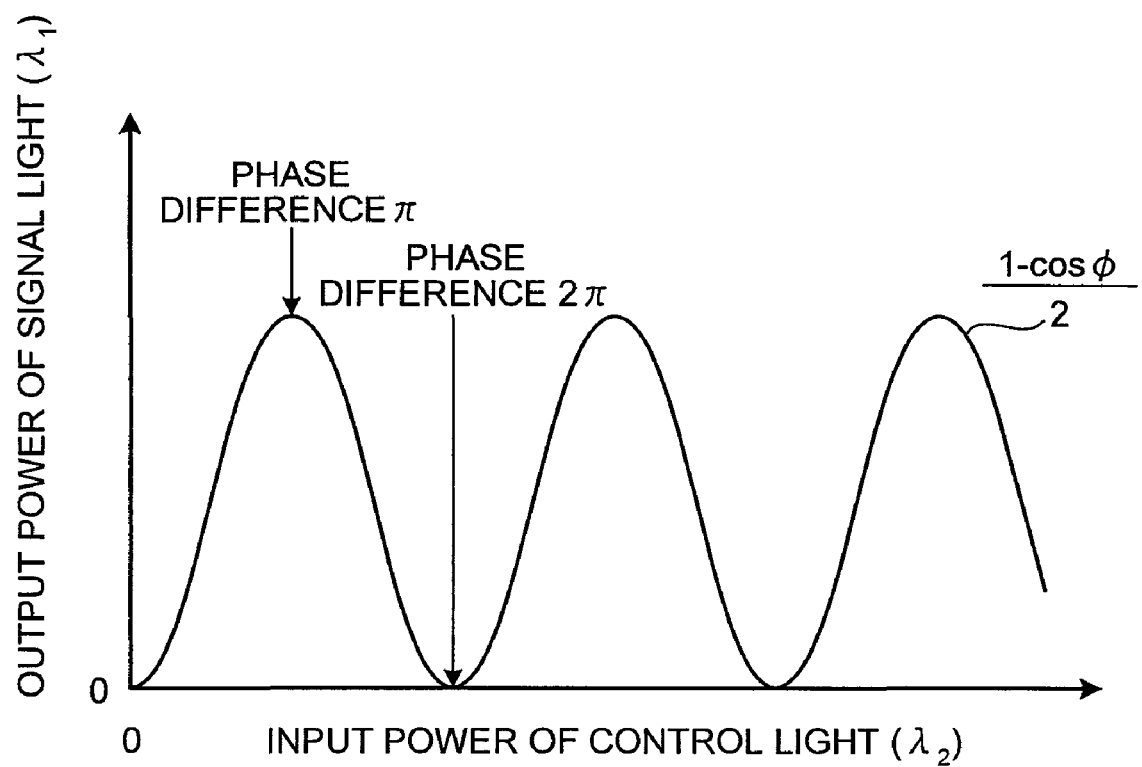
FIG. 6 is a schematic diagram for illustrating an input-output characteristic of an optical encoder.

Due to the phase difference, the probe light propagating in the clockwise direction and the probe light propagating in the counterclockwise direction causes an interference. Because the phase difference is proportional to the intensity of the pulse string of the control light, the output signal light of the pulse string of the probe light from the nonlinear optical loop mirror shows a periodic characteristic shown in FIG. 6 with respect to an input power of the control light. In order to use the characteristic over multiple cycles, a high power is necessary depending on the control light; however, it can be realized by configuring the nonlinear optical loop mirror using, for example, an optical fiber cable having an even higher nonlinearity. Regarding a loop length of the nonlinear optical loop mirror, it is preferable to make it as long as possible because the intensity of the control light can be lower as the loop length is longer. However, it is necessary to make a difference of the group delay as small as possible.

Figure 7:
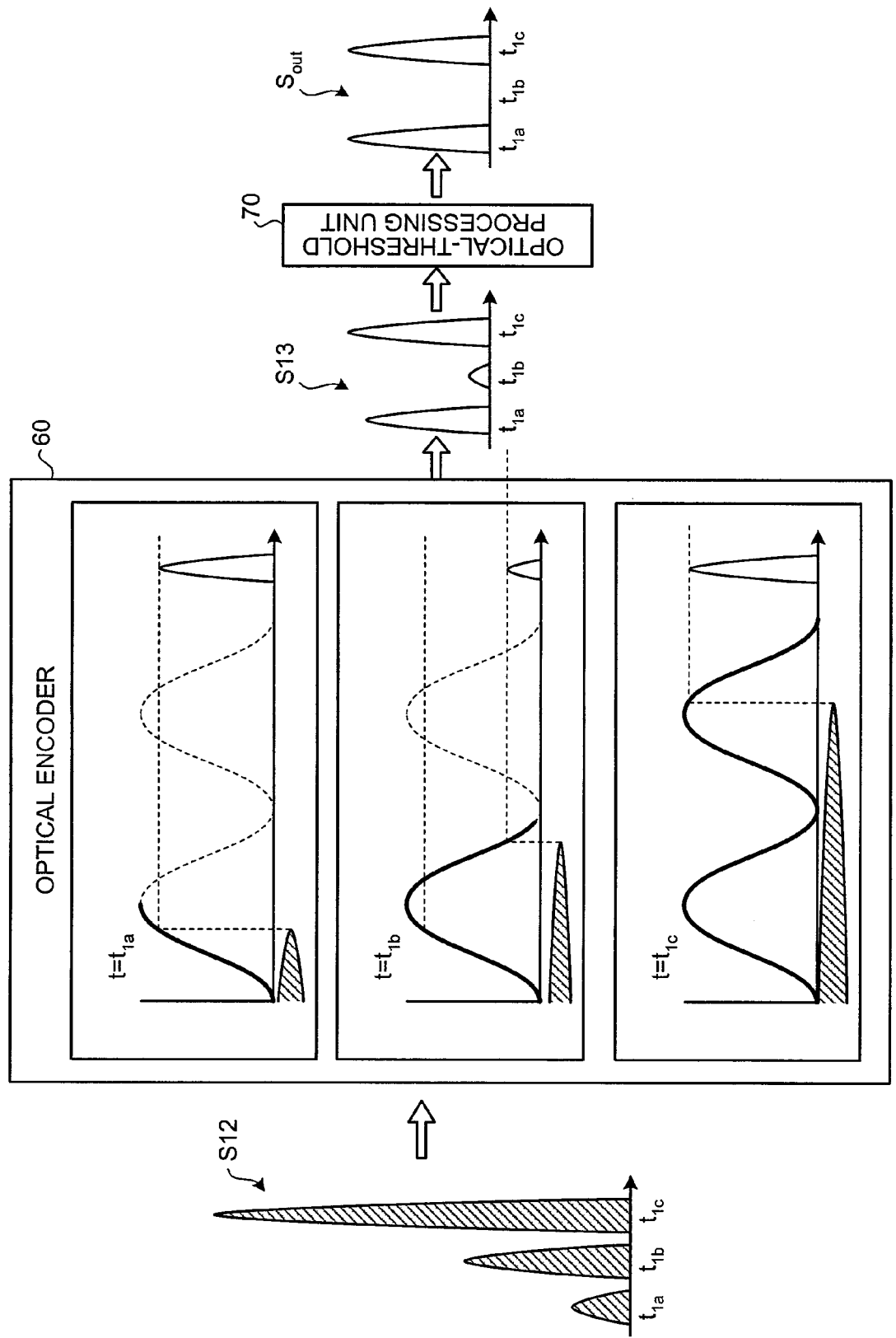
FIG. 7 is a schematic diagram for illustrating an operation of the optical encoder shown in FIG. 1.

FIG. 7 is a schematic diagram for illustrating an operation of the optical encoder 60. In the case of performing the 3-bit encoding, the optical analog/digital converting apparatus 1 needs to have at least two cycles of the input-output characteristic, as shown in FIG. 7. The optical encoder 60 is a single optical encoder. However, because the optical intensity ratio of each of the pulses input at timings $t_{1a}$ to $t_{1c}$ is 1:2:4, the optical encoder 60 shows half cycle of the input-output characteristic with respect to the optical pulse that is the control light at the timing $t_{1a}$, one cycle of the input-output characteristic with respect to the optical pulse that is the control light at the timing $t_{1b}$, and two cycles of the input-output characteristic with respect to the optical pulse that is the control light at the timing $t_{1c}$. In other words, the optical encoder 60 works as an optical encoder having the input-output characteristics different in a time division manner with respect to the optical pulse string input in a time division manner, with a single optical encoder.

Figure 8:
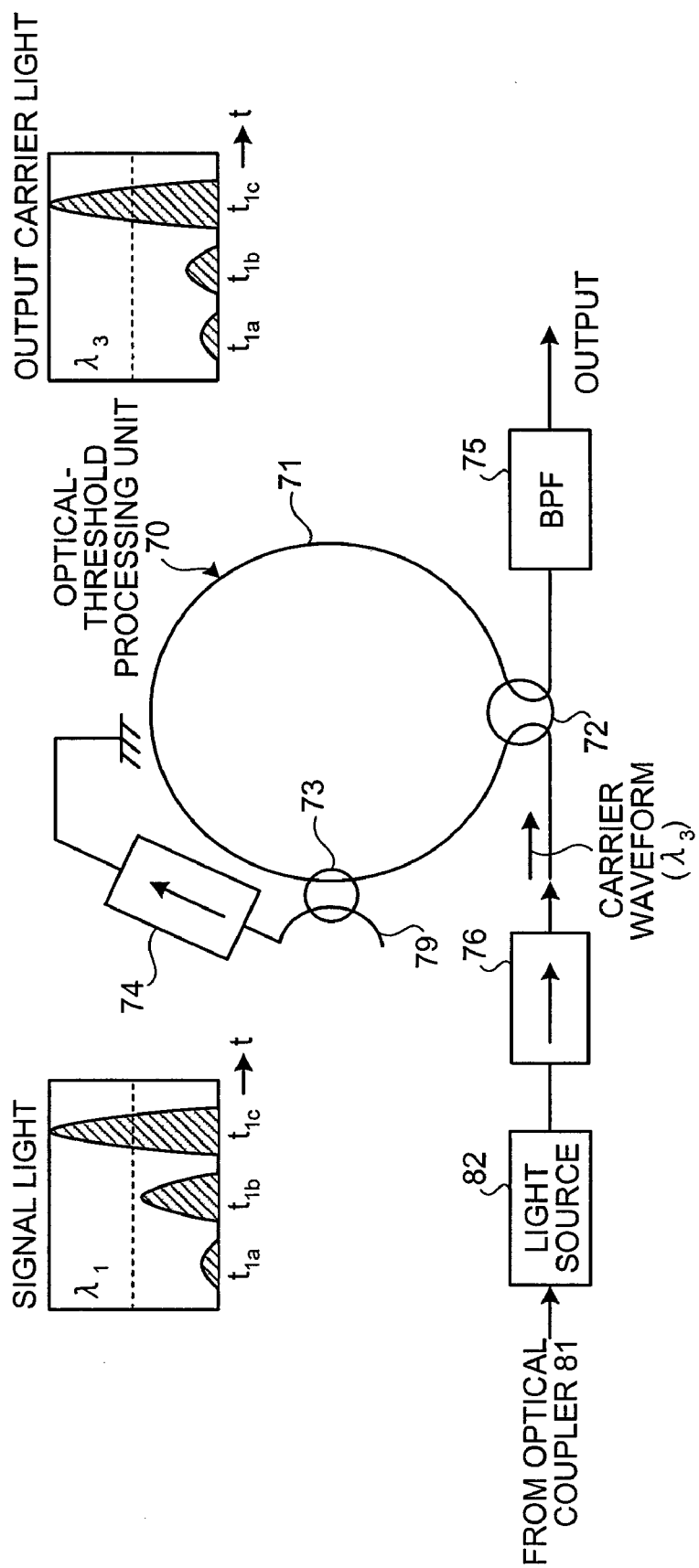
FIG. 8 is a schematic diagram for illustrating a detailed configuration of an optical-threshold processing unit shown in FIG. 1.

FIG. 8 is a schematic diagram for illustrating a detailed configuration of the optical-threshold processing unit 70. In the same manner as the optical encoder 60, the optical-threshold processing unit 70 is a nonlinear optical loop mirror including a high nonlinearity fiber 71, two optical couplers 72 and 73, an optical isolator 74, an optical band pass filter 75, a light source 82, an optical isolator 76, and an optical fiber cable 79. The connection configuration of the high nonlinearity fiber 71, the two optical couplers 72 and 73, the optical isolator 74, the optical band pass filter 75, and the optical fiber cable 79 is the same as the case of the optical encoder 60.

The light source 82 generates the pulse string S31 of a carrier light having a wavelength of $\lambda_3$ and a constant signal level intermittently at a cycle input from the optical coupler 81, and outputs the generated pulse string to one end of the high nonlinearity fiber 71 via the optical isolator 76. On the other hand, the signal light (the optical pulse string S13) from the optical encoder 60 is input via one end of the optical fiber cable 79 and branched by the optical coupler 73. One portion of the signal light passing the optical coupler 73 is terminated in an antireflecting manner via the optical isolator 74; however, the other portion of the signal light branched by an optical coupler 22 is output to the high nonlinearity fiber 71 via the optical coupler 22. In addition, at the other end of the high nonlinearity fiber 71, the optical band pass filter 75 is connected to pass only the wavelength $\lambda_3$ of the carrier light.

Figure 9:
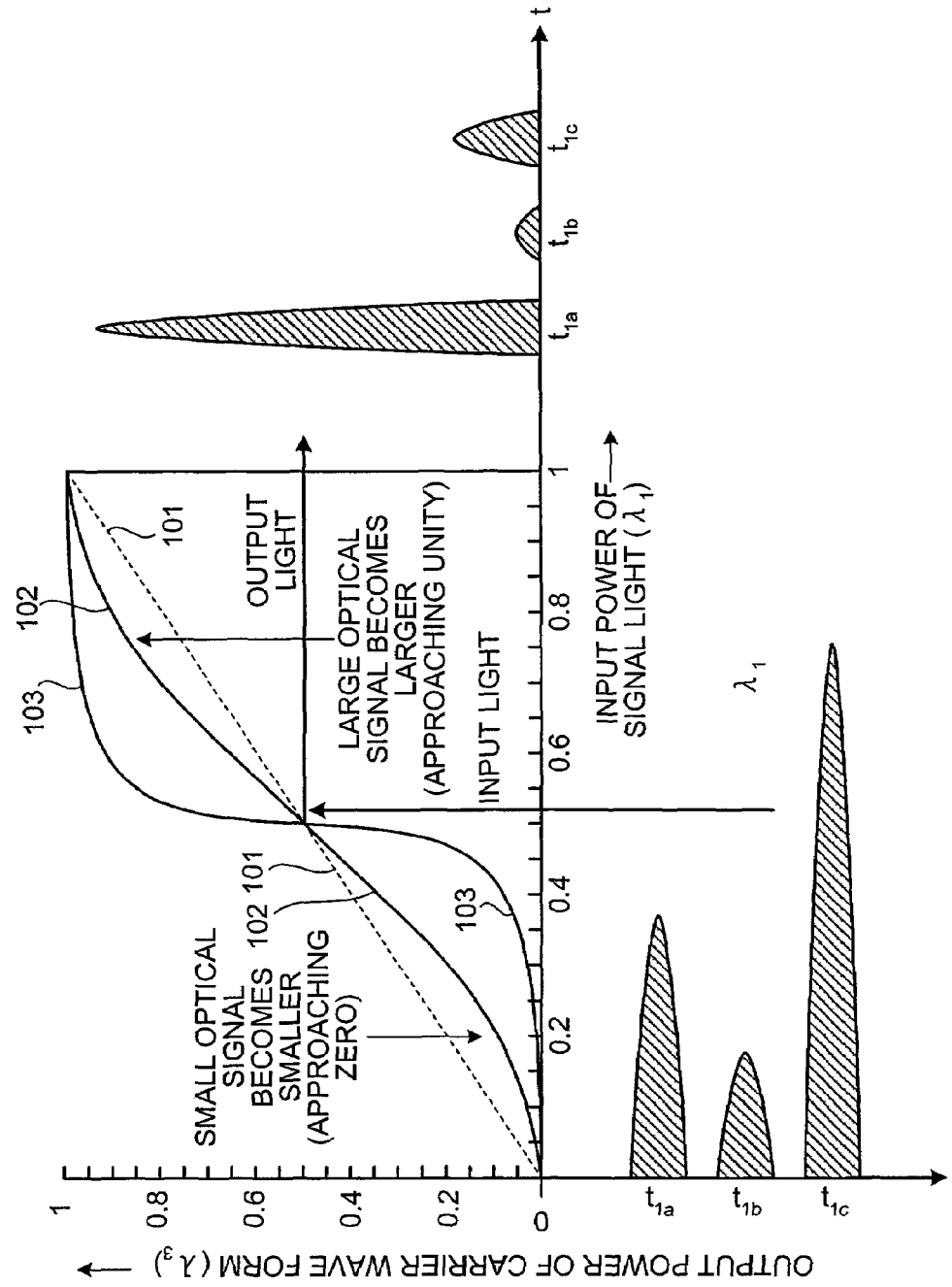
FIG. 9 is a schematic diagram for illustrating an operation of the optical-threshold processing unit shown in FIG. 1.

FIG. 9 is a schematic diagram for illustrating an operation of the optical-threshold processing unit 70 shown in FIG. 1. FIG. 9 shows an operation of the 1-bit quantization. If the input-output of the optical-threshold processing unit 70 is, for example, a linear characteristic 101, the input signal light is output as it is so that it cannot be quantized. However, if the input-output of the optical-threshold processing unit 70 has a first input-output characteristic 102, the input signal light is converted in such a manner that a smaller optical signal approaches even closer to zero and a larger optical signal approaches even closer to one. Furthermore, with a second input-output characteristic 103, it is possible to obtain an output light even closer to a binarization. In order to obtain the second input-output characteristic 103, it is preferable to connect the optical-threshold processing unit 70 in a cascaded manner.

According to the first embodiment, each pulse of the optical pulse string S11 obtained by sampling the optical analog signal $S_{in}$ is branched by the optical-pulse branching delay multiplexer 40 to generate as many duplicates of the optical pulses as the predetermined number of bits, and the temporally consecutive high speed optical pulse string S12 is generated by multiplexing the duplicated optical analog signal pulses with a predetermined intensity difference and time difference. After that, the optical pulse string S12 is encoded and quantized in a high speed in the time division manner by a single unit of the optical encoder 60 and a single unit of the optical-threshold processing unit 70. Therefore, a high speed optical analog/digital conversion process can be performed with a simple configuration.

Second Embodiment

A second embodiment of the present invention is explained below. According to the second embodiment, the optical encoder 60 and the optical-threshold processing unit 70 described above are realized using a Sagnac interferometer type optical switch.

Figure 10:
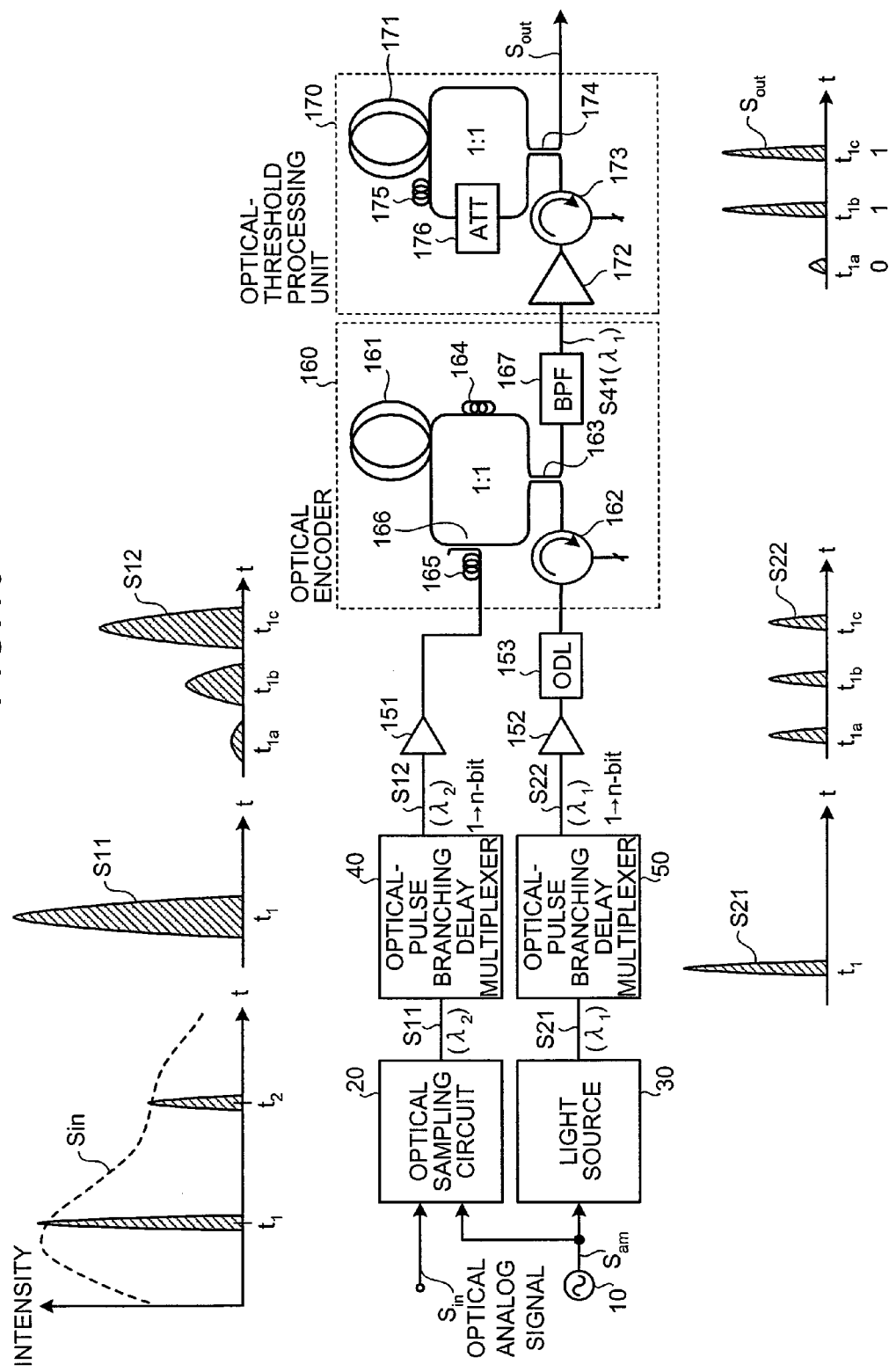
FIG. 10 is a block diagram for illustrating a configuration of an optical analog/digital converting apparatus according to a second embodiment of the present invention.

FIG. 10 is a block diagram for illustrating a configuration of an optical analog/digital converting apparatus according to the second embodiment. As shown in FIG. 10, the optical analog/digital converting apparatus 2 includes an optical encoder 160 and an optical-threshold processing unit 170 that are realized by the Sagnac interferometer type optical switch. The optical analog/digital converting apparatus 2 further includes an optical amplifier 151 between the optical-pulse branching delay multiplexer 40 and the optical encoder 160 and an optical amplifier 152 and an optical delay line (ODL) 153 between the optical-pulse branching delay multiplexer 50 and the optical encoder 160. A proper signal amplification is performed by the optical amplifiers 151 and 152, and a timing adjustment of a pulse is performed by the ODL 153 with a proper signal delay. An optical pulse string S41 output from the optical encoder 160 is binarized as it is and output by the optical-threshold processing unit 170.

The optical encoder 160 includes a high nonlinearity fiber 161 including a polarization controller 164, two optical couplers 163 and 166, an optical band pass filter 167, an optical circulator 162, and a polarization controller 165. The optical pulse string S22 as the probe light is input to the high nonlinearity fiber 161 via the optical circulator 162 and the optical coupler 163, and the optical pulse string S12 as the control light is input to a nonlinear optical loop mirror 161 via the polarization controller 165 and the optical coupler 166. An operation of the optical encoder 160 is the same as the operation of the optical encoder 60, outputting the optical pulse string S41 corresponding to the optical pulse string S13 to the optical-threshold processing unit 170.

The optical-threshold processing unit 170 includes a high nonlinearity fiber 171, an optical coupler 174, an optical circulator 173, an optical amplifier 172, and an optical attenuator 176 and a polarization controller 175 introduced on an optical fiber cable of the high nonlinearity fiber 171. The optical pulse string S41 output from the optical encoder 160 is input to the high nonlinearity fiber 171 via the optical amplifier 172, the optical circulator 173, and the optical coupler 174, and a binarized optical digital signal $S_{out}$ is output from the optical coupler 174.

According to the second embodiment, because the light source 82 and the like required for the optical-threshold processing unit 170 is not necessary, it is possible to realize an optical analog/digital converting apparatus with an even simpler configuration.

Figure 11:
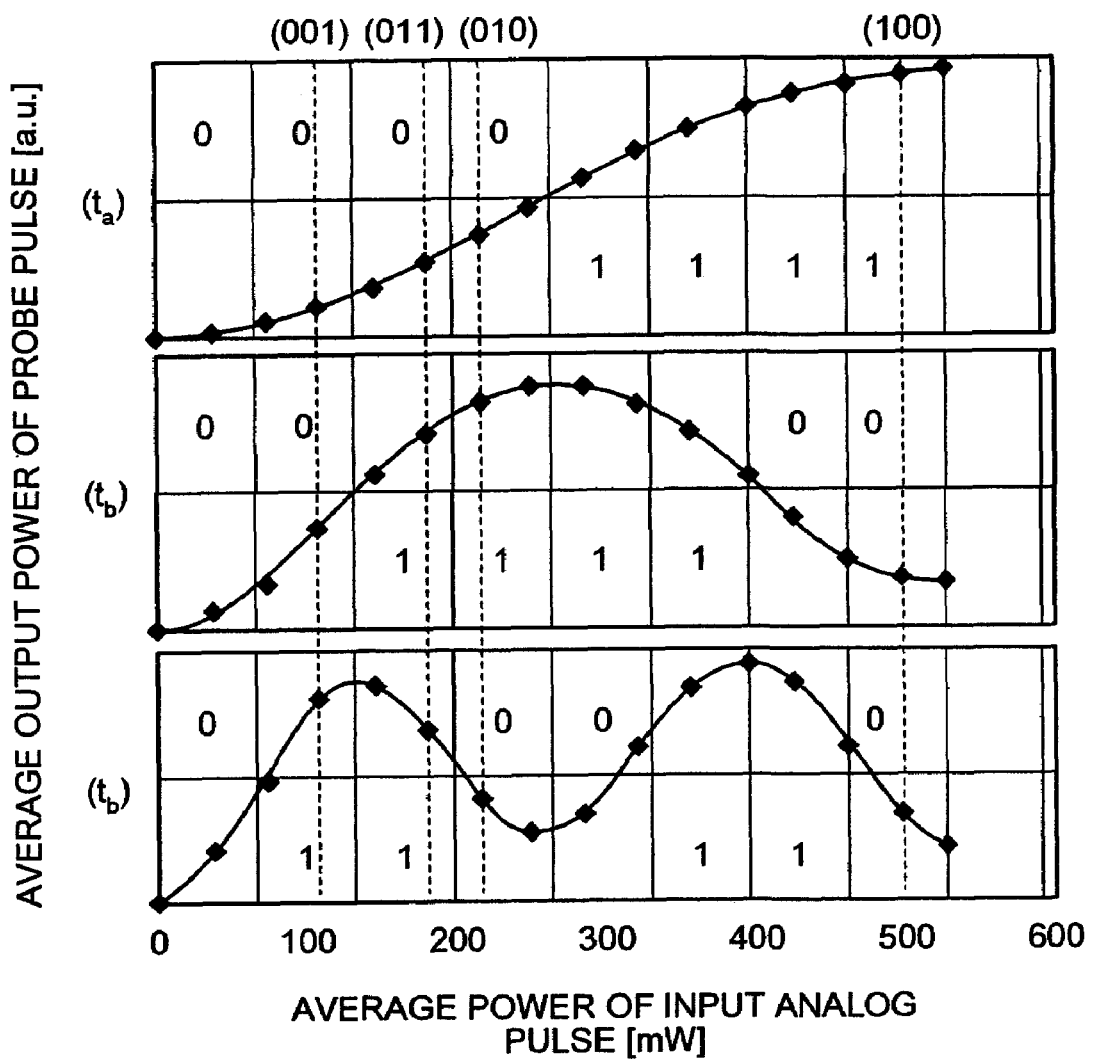
FIG. 11 is a diagram for illustrating an experimental result of FIG. 10, showing a measurement result of an input-output characteristic of the 3-bit optical analog-to-digital conversion at each timing.

FIG. 11 is a diagram for illustrating a measurement result of an input-output characteristic of the 3-bit optical analog-to-digital conversion obtained from an experiment using a configuration of the optical analog-to-digital converting apparatus shown in FIG. 10. It is possible to confirm that the input-output characteristic of the half cycle, the one cycle, and the two cycles required at the respective timings $t1_a$, $t1_b$, and $t1_c$, shown in FIG. 7 could be realized in the experiment. The horizontal axis is an average intensity obtained by changing an output of the optical amplifier 151 to change the intensity of the control pulse, and the vertical axis is an intensity of the probe pulse from the encoder output S41 at each timing.

Figure 12:
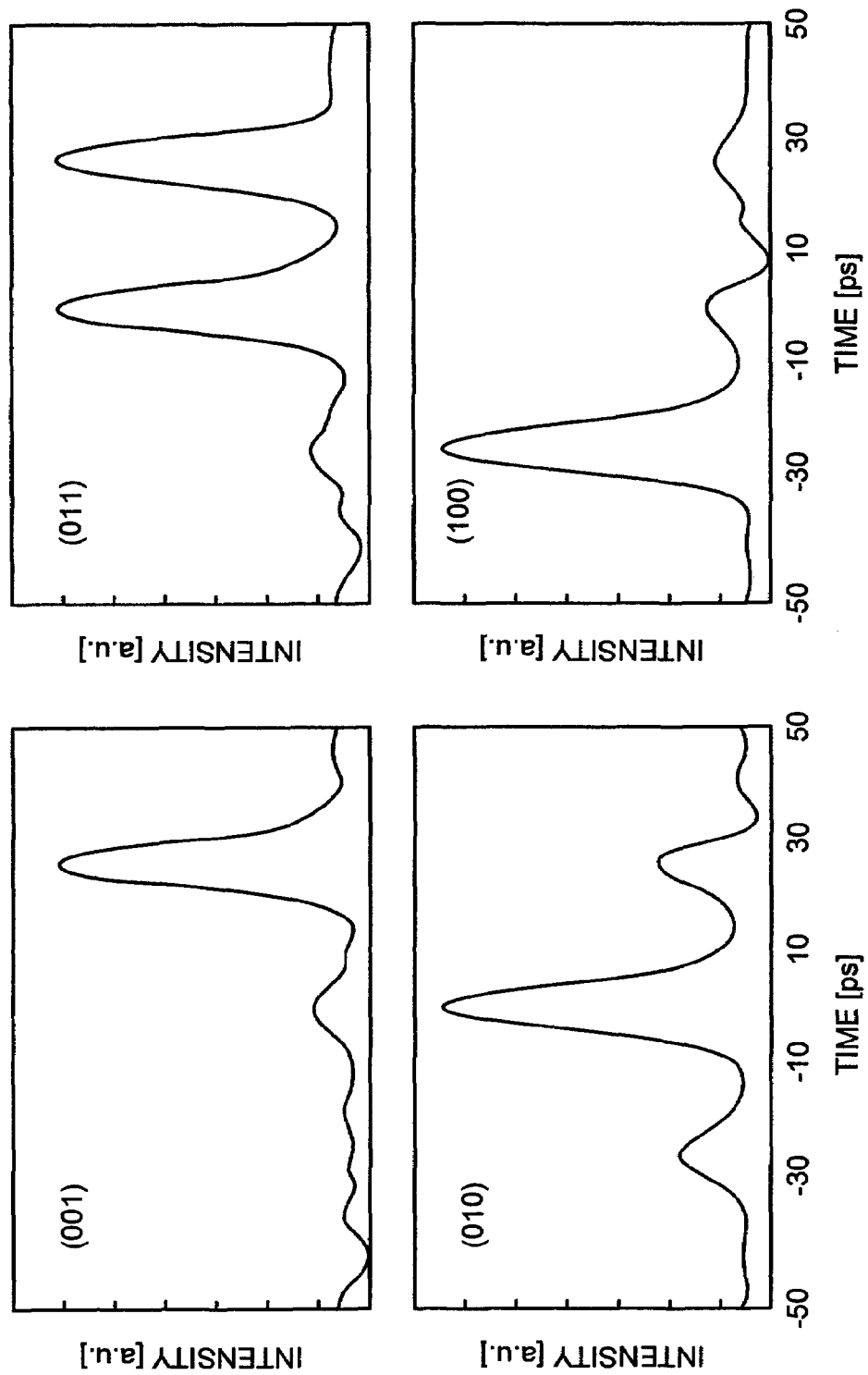
FIG. 12 is a diagram for illustrating an experimental result of FIG. 10, showing a temporal waveform of an output $S_{out}$ of the optical-threshold processing unit of the 3-bit optical analog-to-digital conversion.

FIG. 12 is a diagram for illustrating a measurement result of the output $S_{out}$ of the optical-threshold processing unit of the 3-bit optical analog-to-digital conversion obtained from an experiment using the configuration of the optical analog-to-digital converting apparatus shown in FIG. 10. A result in the case where the output codes are "001", "011", "010", and "100" is shown in the figure. These outputs are obtained by performing a threshold processing of an output at an input analog pulse intensity indicated by a broken line shown in FIG. 10, with performing a measurement with a sampling oscilloscope after an optical-electrical conversion.

According to the first and the second embodiments described above, the optical-pulse branching delay multiplexers 40 and 50 employ the demultiplexer 41 and the multiplexer 44; however, the present invention is not limited to this scheme, but it can be realized using a device obtained by combining a circulator and an FBG. Furthermore, although the optical-pulse branching delay multiplexers 40 attenuates the signal by the optical attenuators 43-1 to 43-3 after delaying the signal by the optical delay units 42-1 to 42-3, the present invention is not limited to this scheme, but the delay process can be performed after attenuating the optical signal. Moreover, although the optical-pulse branching delay multiplexers 40 performs the optical attenuation by using the optical attenuators 43-1 to 43-3, the present invention is not limited to this scheme, but the intensity ratio can be set using an optical amplification.

Furthermore, according to the first and the second embodiments described above, the optical encoders 60 and 160 and the optical-threshold processing units 70 and 170 are realized by using the nonlinear optical loop mirror; however, the present invention is not limited to this scheme, but it can be realized by using a variety of optical switches. For instance, a waveguide type Mach-Zender interferometer can be used instead, and an optical fiber cable of an optical waveguide having a nonlinear optical effect such as the optical Kerr effect can also be used.

INDUSTRIAL APPLICABILITY

As described above, the optical analog/digital converting method and the optical analog/digital converting apparatus according to the present invention are useful in the field where an optical analog signal is directly converted into an optical digital signal. In particular, the optical analog/digital converting method and the optical analog/digital converting apparatus according to the present invention are suitable for a field including a measurement device in which a high speed sampling is required, a node of the optical communications where a conversion between the optical analog signal and the optical digital signal is required, and a computing where a high speed analog/digital conversion is required.

The invention claimed is:

1. An optical analog/digital converting method comprising:

an optical pulse branch-delay-multiplexing step of generating as many duplicates of each optical analog signal pulse as predetermined number of bits obtained by branching each optical analog signal pulse that is sampled from an input optical analog signal, and generating and outputting a temporally consecutive optical pulse string by multiplexing the each duplicated optical analog signal pulses with a predetermined intensity difference and time difference; and a quantization and encoding step of outputting an optical digital signal corresponding to the optical analog signal by performing an encoding and a quantization of the optical pulse string.

2. The optical analog/digital converting method according to claim 1, further comprising:

a probe light generating step of generating a probe optical pulse string synchronized with the optical pulse string, wherein the quantization and encoding step includes an encoding step of performing a quantization and encoding by using an optical switch that performs an optical output of the probe optical pulse string according to an intensity of the optical pulse string by using a nonlinear optical effect.

3. The optical analog/digital converting method according to claim 1, wherein the quantization and encoding step includes multiplexing the optical pulse string and the probe optical pulse string with a predetermined time difference such that the optical pulse string and the probe optical pulse string are temporally overlapped in an optical multiplexer, by using a nonlinear optical loop mirror having two inputs of the optical pulse string and the probe optical pulse string and one output or two outputs of a transmitted light or a reflected light of the probe optical pulse string.

4. The optical analog/digital converting method according to claim 1, wherein the optical pulse branch-delay-multiplexing step includes duplicating n pieces of duplicated optical analog signal pulses when performing an n-bit encoding, where n is a natural number, and attenuating or amplifying the n pieces of duplicated optical analog signal pulses such that the n pieces of duplicated optical analog signal pulses have predetermined different intensity ratios.

5. The optical analog/digital converting method according to claim 4, wherein the quantization and encoding step includes performing a quantization and encoding by using an optical nonlinear device having a predetermined cycle of an input-output characteristic with respect to an optical intensity, and the optical nonlinear device has at least a cycle of $2^{(n-1)}$ times of a half cycle.

6. The optical analog/digital converting method according to claim 1, further comprising:

a binary probe light generating step of generating a binary probe optical pulse string synchronized with the optical pulse string, wherein the quantization and encoding step includes a threshold processing of generating a digital pulse string binarized according to an intensity of the probe optical pulse string quantized and encoded by using a nonlinear optical effect.

7. An optical analog/digital converting apparatus comprising:

an optical pulse branch-delay-multiplexing means for generating as many duplicates of each optical analog signal pulse as predetermined number of bits obtained by branching each optical analog signal pulse that is sampled from an input optical analog signal, and generating and outputting a temporally consecutive optical pulse string by multiplexing the each duplicated optical analog signal pulses with a predetermined intensity difference and time difference; and a quantization and encoding means for outputting an optical digital signal corresponding to the optical analog signal by performing an encoding and a quantization of the optical pulse string.

8. The optical analog/digital converting apparatus according to claim 7, further comprising:

a probe light generating means for generating a probe optical pulse string synchronized with the optical pulse string, wherein the quantization and encoding means includes an encoding means for performing a quantization and encoding by using an optical switch that performs an optical output of the probe optical pulse string according to an intensity of the optical pulse string by using a nonlinear optical effect.

9. The optical analog/digital converting apparatus according to claim 7, wherein the quantization and encoding means multiplexes the optical pulse string and the probe optical pulse string with a predetermined time difference such that the optical pulse string and the probe optical pulse string are temporally overlapped in an optical multiplexer, by using a nonlinear optical loop mirror having two inputs of the optical pulse string and the probe optical pulse string and one output or two outputs of a transmitted light or a reflected light of the probe optical pulse string.

10. The optical analog/digital converting apparatus according to claim 7, wherein the optical pulse branch-delay-multiplexing means duplicates n pieces of duplicated optical analog signal pulses when performing an n-bit encoding, where n is a natural number, and attenuates or amplifies the n pieces of duplicated optical analog signal pulses such that the n pieces of duplicated optical analog signal pulses have predetermined different intensity ratios.

11. The optical analog/digital converting apparatus according to claim 10, wherein the quantization and encoding means performs a quantization and encoding by using an optical nonlinear device having a predetermined cycle of an input-output characteristic with respect to an optical intensity, and the optical nonlinear device has at least a cycle of $2^{(n-1)}$ times of a half cycle.

12. The optical analog/digital converting apparatus according to claim 7, further comprising:

a binary probe light generating means for generating a binary probe optical pulse string synchronized with the optical pulse string, wherein the quantization and encoding means includes a threshold processing means for generating a digital pulse string binarized according to an intensity of the probe optical pulse string quantized and encoded by using a nonlinear optical effect.

* * * * *